United States Patent
Prasad et al.

(10) Patent No.: US 10,332,748 B2
(45) Date of Patent: Jun. 25, 2019

(54) ETCH RATE MODULATION THROUGH ION IMPLANTATION

(71) Applicant: Varian Semiconductor Equipment Associates, Inc., Gloucester, MA (US)

(72) Inventors: Rajesh Prasad, Lexington, MA (US); Steven Robert Sherman, Newton, MA (US); Andrew M. Waite, Beverly, MA (US); Sungho Jo, Chestnut Hill, MA (US); Kyu-Ha Shim, Andover, MA (US); Guy Oteri, Merrimac, MA (US); Somchintana Norasetthekul, Boxford, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/900,989

(22) Filed: Feb. 21, 2018

(65) Prior Publication Data

US 2018/0182636 A1 Jun. 28, 2018

Related U.S. Application Data

(62) Division of application No. 14/975,968, filed on Dec. 21, 2015, now Pat. No. 9,934,982.

(51) Int. Cl.
| | |
|---|---|
| *H01L 21/3065* | (2006.01) |
| *H01L 21/265* | (2006.01) |
| *H01L 21/308* | (2006.01) |
| *H01L 21/311* | (2006.01) |
| *H01L 21/3115* | (2006.01) |

(Continued)

(52) U.S. Cl.
CPC ........ *H01L 21/3065* (2013.01); *H01L 21/266* (2013.01); *H01L 21/26506* (2013.01); *H01L 21/3081* (2013.01); *H01L 21/3086* (2013.01); *H01L 21/30604* (2013.01); *H01L 21/31116* (2013.01); *H01L 21/31133* (2013.01); *H01L 21/31138* (2013.01); *H01L 21/31144* (2013.01); *H01L 21/31155* (2013.01); *Y10S 438/914* (2013.01); *Y10S 438/924* (2013.01)

(58) Field of Classification Search
None
See application file for complete search history.

(56) References Cited

U.S. PATENT DOCUMENTS

| | | |
|---|---|---|
| 5,468,342 A | 11/1995 | Nulty et al. |
| 5,585,658 A | 12/1996 | Mukai et al. |

(Continued)

*Primary Examiner* — Jiong-Ping Lu
(74) *Attorney, Agent, or Firm* — Nields, Lemack & Frame, LLC

(57) ABSTRACT

As etching processes become more aggressive, increased etch resistivity of the hard mask is desirable. Methods of modulating the etch rate of the mask and optionally the underlying material are disclosed. An etch rate modifying species is implanted into the hard mask after the mask etching process is completed. This etch rate modifying species increases the difference between the etch rate of the mask and the etch rate of the underlying material to help preserve the integrity of the mask during a subsequent etching process. In some embodiments, the etch rate of the mask is decreased by the etch rate modifying species. In certain embodiments, the etch rate of the underlying material is increased by the etch rate modifying species.

10 Claims, 6 Drawing Sheets

(51) Int. Cl.
*H01L 21/266* (2006.01)
*H01L 21/306* (2006.01)

(56) References Cited

U.S. PATENT DOCUMENTS

| | | | |
|---|---|---|---|
| 6,004,864 A * | 12/1999 | Huang | H01L 21/761 |
| | | | 148/DIG. 50 |
| 6,261,964 B1 * | 7/2001 | Wu | H01L 21/2815 |
| | | | 257/E21.011 |
| 6,326,300 B1 | 12/2001 | Liu et al. | |
| 9,934,982 B2 | 4/2018 | Prasad et al. | |
| 2008/0286954 A1 | 11/2008 | Kim et al. | |
| 2013/0288471 A1 * | 10/2013 | Chi | H01L 29/665 |
| | | | 438/586 |
| 2016/0276465 A1 | 9/2016 | Hung et al. | |
| 2017/0178914 A1 | 6/2017 | Prasad et al. | |

* cited by examiner

ETCH RATE MODULATION THROUGH ION IMPLANTATION

This application is a divisional application of U.S. patent application Ser. No. 14/975,968, filed Dec. 21, 2015, (now U.S. Pat. No. 9,934,982 issued Apr. 3, 2018), the disclosure of which is incorporated herein by reference in its entirety.

FIELD

This disclosure relates to methods of processing workpieces and, more particularly, to altering the etch rate of materials disposed on workpieces using ion implantation.

BACKGROUND

Semiconductor fabrication comprises many discrete processes to create the desired features or devices. Some of these processes include lithography, etching, deposition and ion implantation.

Often, in the case of etching, a material, also referred to as a mask or hard mask, is disposed on the surface to be etched. Portions of the hard mask are removed, creating openings that expose some material or the underlying workpiece. The opening in the hard mask after this process is referred to as the critical dimension (CD). There is an inherent CD variation across several similar structures, both within a die and across the workpiece. CD variability impacts circuit performance and reduction of this variability is beneficial.

The exposed material or underlying workpiece is then treated with an etching process, which removes the exposed material or underlying workpiece.

This etching process functions due to the difference in etch rate between the hard mask and etch rate of the underlying material or workpiece. In other words, the etching process removes the material or underlying workpiece at a faster rate than it removes the hard mask. In this way, the exposed material or workpiece is etched, while the hard mask protects other portions of the workpiece.

However, as semiconductor fabrication processes continue to evolve, the initial openings in the hard mask prior to the etching process are becoming narrower. A narrower opening implies that either a longer or more aggressive etching process is performed to remove the desired amount of material or underlying workpiece.

This longer or more aggressive etching process may remove material from the hard mask and/or modify the hard mask shape. If too much of the hard mask is removed, the hard mask will no longer be able to protect the rest of the workpiece from the etching process. If the hard mask shape is modified during the etch process, the resulting CD may be different from the intended value. This effect creates an inherent CD variation across the die and workpiece. To compensate for this more aggressive etching process, the hard mask may be made thicker, to account for the removal of the hard mask by the etching process. In another embodiment, a different type of material, which is more resistant to etching, may be used for the hard mask.

However, these changes may cause modifications to the semiconductor fabrication process, which may be expensive or difficult to implement or may result in increased CD variation. Therefore, it would be advantageous if there was a method to modulate the etch resistance of the hard mask and other materials to allow currently used materials to continue to be exploited. Further, it would be beneficial if this method did not affect the overall throughput of the semiconductor fabrication process.

SUMMARY

As etching processes become more aggressive, increased etch resistivity of the hard mask is desirable. Methods of modulating the etch rate of the mask and optionally the underlying material are disclosed. An etch rate modifying species is implanted into the hard mask after the mask etching process is completed. This etch rate modifying species increases the difference between the etch rate of the mask and the etch rate of the underlying material to help preserve the integrity of the mask during a subsequent etching process. In some embodiments, the etch rate of the mask is decreased by the etch rate modifying species. In certain embodiments, the etch rate of the underlying material is increased by the etch rate modifying species.

According to one embodiment, a method of processing a workpiece is disclosed. The method comprises creating an opening in a mask disposed on a surface of the workpiece, so as to expose a portion of a material disposed beneath the mask; implanting an etch rate modifying species into the mask and the portion of the material disposed beneath the mask; and etching the portion of the material disposed beneath the mask; wherein the etch rate modifying species increases a difference between an etch rate of the mask and an etch rate of the material. In certain embodiments, the etch rate modifying species decreases the etch rate of the mask. In certain embodiments, the etch rate modifying species increases the etch rate of the material. In certain embodiments, a layer is disposed between the workpiece and the mask, which may be a silicon dioxide layer. In certain embodiments, the material comprises the workpiece.

According to another embodiment, a method of processing a workpiece is disclosed. The method comprises creating an opening in a mask disposed on an epitaxial silicon layer, the epitaxial silicon layer disposed on a surface of the workpiece, so as to expose a portion of the epitaxial silicon layer disposed beneath the mask; implanting a first etch rate modifying species into the mask after creating the opening; and performing an etching process to create a channel in the portion of the epitaxial silicon layer, wherein the first etch rate modifying species decreases an etch rate of the mask. In certain embodiments, the first etch rate modifying species is implanted at an angle. In certain embodiments, the first etch rate modifying species comprises boron, carbon, silicon or germanium. In certain embodiments, the method further comprises implanting a second etch rate modifying species into the mask and the portion of the epitaxial silicon layer disposed beneath the mask prior to the etching process. In certain embodiments, the second etch rate modifying species increases the etch rate of the epitaxial silicon layer, and may comprise phosphorus, silicon, or antimony. In other embodiments, the second etch rate modifying species decreases the etch rate of the epitaxial silicon layer, and may comprise boron, carbon, aluminum, gallium or indium.

According to another embodiment, a method of processing a workpiece is disclosed. The method comprises creating an opening in a mask disposed on an silicon dioxide layer, the silicon dioxide layer disposed on a surface of the workpiece, so as to expose a portion of the silicon dioxide layer disposed beneath the mask; implanting an etch rate modifying species into the mask and the portion of the silicon dioxide layer; and etching the portion of the silicon dioxide layer; wherein the etch rate modifying species increases a difference between an etch rate of the mask and an etch rate of the silicon dioxide layer. In certain embodiments, the mask comprises silicon nitride. In certain embodiments, the etch rate modifying species is selected from the group consisting of boron and carbon.

BRIEF DESCRIPTION OF THE DRAWINGS

For a better understanding of the present disclosure, reference is made to the accompanying drawings, which are incorporated herein by reference and in which.

DETAILED DESCRIPTION

Figure 1:
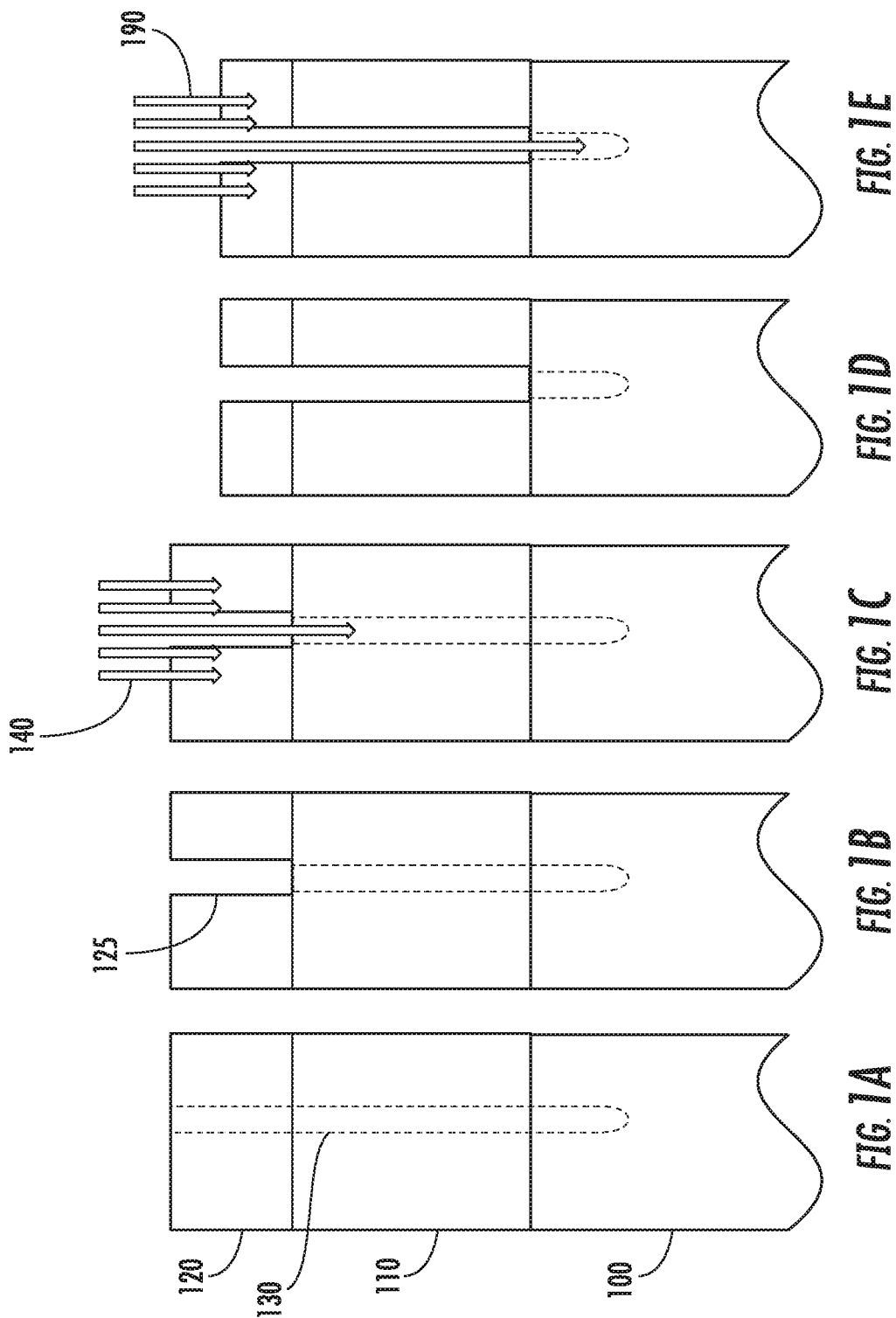
FIGS. 1A-1E show a sequence of processes that may be performed on a workpiece according to one embodiment.

The present disclosure describes the use of etching and ion implantation processes. Etching processes are well known in the art and may include either dry processes, such as via ion implantation, or wet processes, such as via the use of hydrofluoric acid or another acid. Similarly, ion implantation is well known in the art and may be achieved using a beam line ion implantation system, a plasma chamber, or any other suitable implantation system. The disclosure is not limited to any particular embodiment.

Vertical channels may be formed on the top surface of a workpiece. This may be done by applying a mask, such as a hard mask, to the entirety of the top surface of the workpiece. Openings are then created in the mask in those regions where the channels are intended to be disposed. The removal of the mask exposes the underlying material. In certain embodiments, the workpiece may be directly beneath the mask. In other embodiments, a layer, such as a silicon dioxide layer, may be disposed under the mask. The workpiece is then subjected to an etching process. The etching process attacks both the mask and the exposed material. However, since the mask is more resistant to the etching process, much more of the exposed material is etched, while the mask is able to protect the remainder of the workpiece.

Further, as noted above, as channels become narrower, the etching processes may be modified. For example, in certain embodiments, the etching process may be longer in terms of duration. In other embodiments, the etching process may be more aggressive, such as by increasing the energy used for an ion based etching process. These modifications may cause more of the mask to be removed or the shape of the mask to be altered. In certain embodiments, the entire mask may be etched by this modified etching process.

This may result in increased CD variability. A more etch resistant hard mask, which optionally may be made thinner, may reduce CD variability.

In one embodiment, this phenomenon is compensated for by modulating the etch rate of the mask, the underlying material, or both. Throughout this disclosure, the phrase "etch rate" is used to denote the rate at which material is removed by an etching process. The phrase "etch resistance" is used to denote a material's ability to withstand an etching process. Thus, an increase in etch resistance lowers the material's etch rate, while a decrease in etch resistance increases the material's etch rate.

The integrity of the mask during the etching process may be improved by increasing the etch rate of the underlying material as compared to the etch rate of the mask. This may be achieved in a number of ways. First, the etch resistance of the mask may be increased, while the etch resistance of the underlying material is not affected. Second, the etch resistance of the mask may be increased, while the etch resistance of the underlying material is decreased. Third, the etch resistance of the mask may be increased, while the etch resistance of the underlying material is also increased, but to a lesser degree. In each of these embodiments, the etch resistance of the mask is increased.

However, other embodiments are also possible. For example, the etch resistance of the underlying material may be lowered while the etch resistance of the mask is unaffected. In another embodiment, the etch resistance of the underlying material may be decreased, while the etch resistance of the mask is also decreased, but to a lesser degree.

In other words, in each of these embodiments, the integrity of the mask is improved by increasing the difference between the etch rate of the mask and the etch rate of the underlying material. The etch rate of the underlying material is always greater than the etch rate of the mask. However, by further increasing the difference between these two etch rates, less of the mask may be etched.

It has been discovered that this result can be achieved by the ion implantation of select species into the mask and the underlying material. These species may be referred to as etch rate modifying species.

FIGS. 1A-1E show a first sequence of processes that may be used to affect the etch resistance of the mask and/or the underlying material to achieve improved etch results. In FIG. 1A, a workpiece 100 is shown. The workpiece 100 may have a layer 110 disposed thereon. This layer 110 may be a silicon dioxide layer, although other embodiments are also possible. Disposed on top of the layer 110 is a mask 120. The mask 120 may be a nitride material, such as silicon nitride. The mask 120 may be applied directly to the top surface of the layer 110. In this example, a channel 130 is to be created in the layer 110.

In other embodiments, there may not be a layer 110. In such an embodiment, the mask 120 may be applied to the top surface of the workpiece 100, and the channel may be formed in the workpiece 100.

In FIG. 1B, an opening 125 is made in the mask 120. This may be performed using a wet etch process, where dilute hydrofluoric acid is used to remove the mask 120 in the target area. This etch process may be referred to as the mask etching process.

After the opening 125 has been created, an ion implantation process may be performed using an etch rate modifying species 140, as shown in FIG. 1C. In certain embodiments, this ion implantation process is performed as a blanket implant, signifying that the entirety of the surface of the workpiece is subjected to the ion implantation. In other embodiments, the ion implantation process may be more selectively applied, such as by using a patterned implant. In this embodiment, the etch rate modifying species 140 is selected based on its ability to increase the difference between the etch rate of the mask 120 and the etch rate of the layer 110. In the embodiment where a layer 110 is not present, the etch rate modifying species 140 may be selected based on its ability to increase the difference between the etch rate of the mask 120 and the etch rate of the workpiece 100.

After the etch rate modifying species 140 has been implanted, the layer 110 is then etched to create channel 130, as shown in FIG. 1D. This etch may be a dry etch or a wet etch process, and the disclosure is not limited to any particular embodiment. This etching process may be referred to as the layer etching process.

In the embodiment where a layer 110 is not used, the etching process shown in FIG. 1D may be used to remove some of the underlying workpiece, creating a channel in the workpiece 100.

After the channel 130 has been created, subsequent processes may be performed, as shown in FIG. 1E. In certain embodiments, an implant of ions 190 is performed so as to implant ions 190 into the exposed portion of the workpiece 100.

Figure 2:
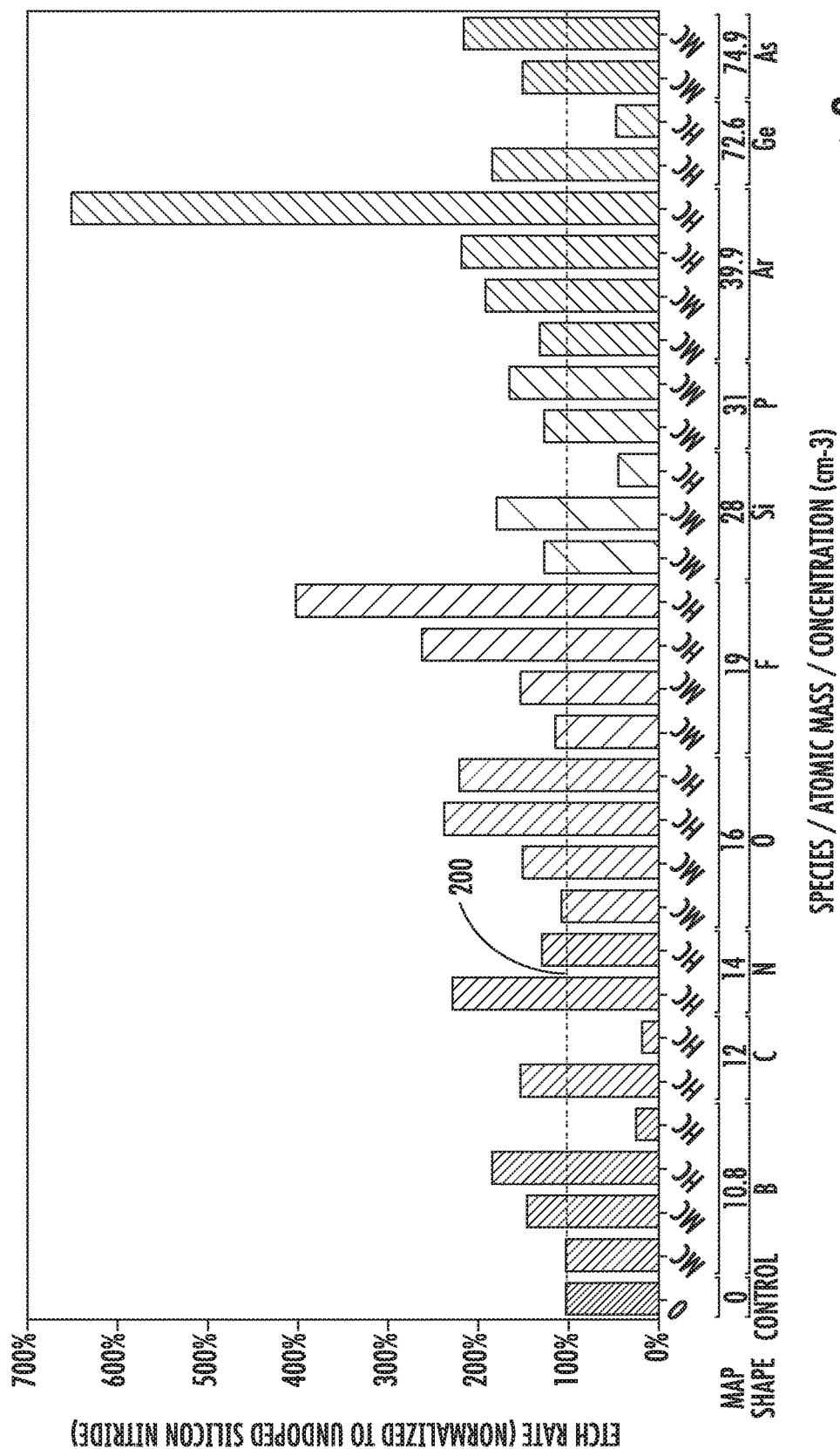
FIG. 2 shows the etch rate of silicon nitride after implantation by various species.

FIG. 1C shows the implantation of an etch rate modifying species 140. FIG. 2 shows the impact that the implantation of various species has on the etch rate of silicon nitride, which is commonly used as the mask 120. Dotted line 200 shows the etch rate of a normal, undoped silicon nitride mask. Any bar graphs that extend above the dotted line 200 indicate that the etch rate of the silicon nitride has been increased by the ion implantation of that particular species at that particular concentration. Implants are classified as high current (HC), wherein the dose is in the range of 5e15 to 1e17 $cm^{-2}$, and medium current (MC), where the dose is in the range of 5e12 to 1e14 $cm^{-2}$. Any bar graphs that are below the dotted line 200 indicate that the etch rate of the silicon nitride has been decreased by the implant of that particular species at that particular concentration. Looking at FIG. 2, it can be seen that implants of boron and carbon at high current (HC) doses significantly reduce the etch rate of the silicon nitride. In fact, the etch rate of the silicon nitride is decreased by a factor of 5 for these two species. It is also noted that implants of silicon and germanium also reduce the etch rate of the silicon nitride by a factor of 2. An implant of most of the other species shown in FIG. 2 results in an increase in the etch rate of the silicon nitride.

Figure 3:
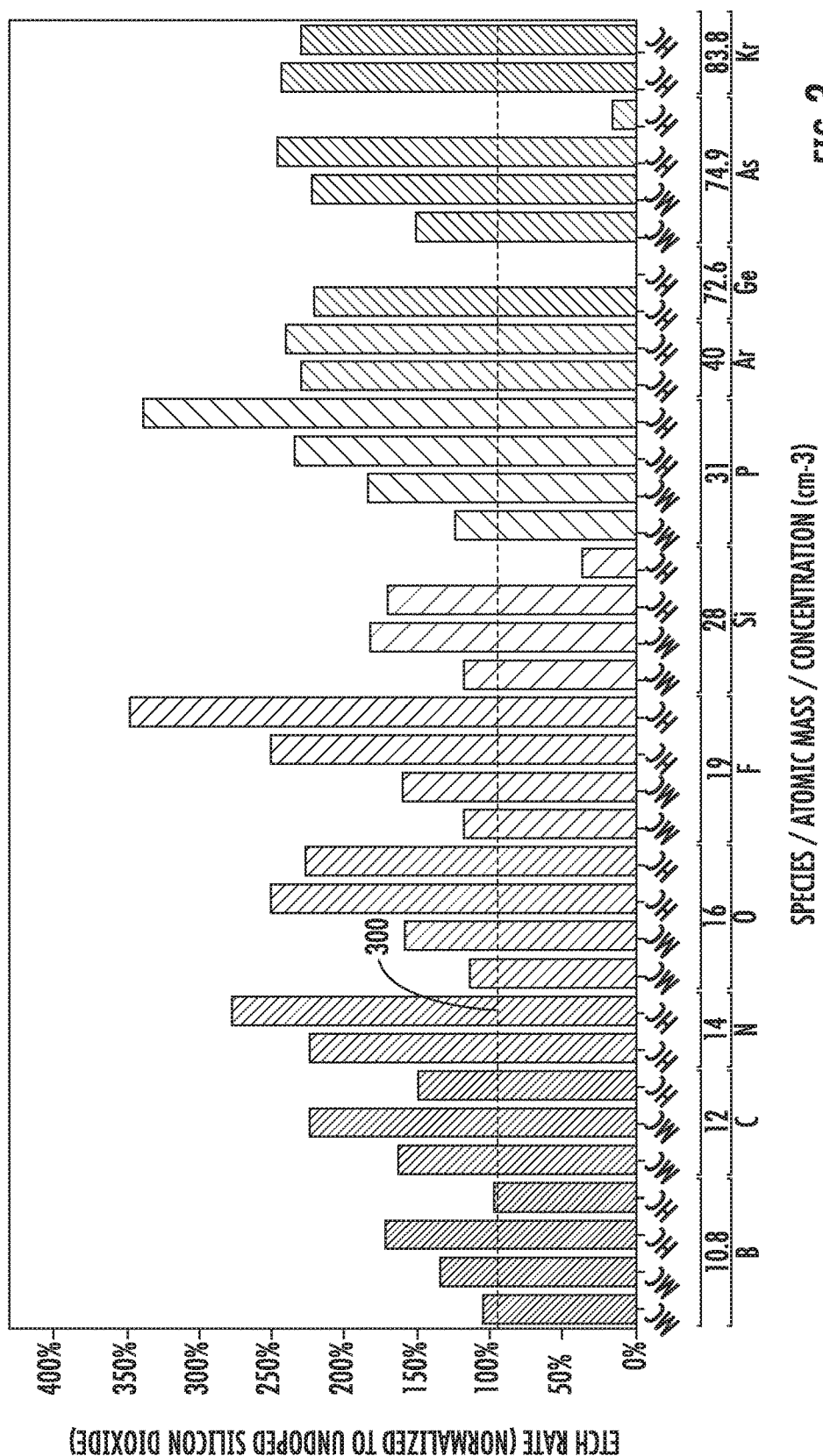
FIG. 3 shows the etch rate of silicon dioxide after implantation by various species.

FIG. 3 shows a similar graph for a silicon dioxide layer, which may be used to create layer 110. Dotted line 300 represents the etch rate of a normal, undoped silicon dioxide layer. Any bar graphs that extend above the dotted line 300 indicate that the etch rate of the silicon dioxide layer has been increased by the implant of that particular species at that particular concentration. Any bar graphs that are below the dotted line 300 indicate that the etch rate of the silicon dioxide layer has been decreased by the implant of that particular species at that particular concentration. Looking at FIG. 3, it can be seen that an ion implantation of boron at a high current (HC) dose has almost no effect on the etch rate of the silicon dioxide layer. An implant of carbon at a high current (HC) increases the etch rate of the silicon dioxide by a factor of roughly 1.5. It is also seen that implants of silicon and germanium lower the etch rate of the silicon dioxide.

Taking these results in combination, it can be demonstrated that if carbon is used as the etch rate modifying species 140 in FIG. 1C, the etch rate of the mask 120 will be decreased by a factor of 5, while the etch rate of the layer 110 will be increased by a factor of 1.5! The use of boron as the etch rate modifying species 140 also decreased the etch rate of the mask 120 by a factor of 5, while minimally changing the etch rate of the layer 110. Thus, the implantation of boron or carbon as the etch rate modifying species 140 may greatly improve the integrity of the mask 120 during the layer etching process, shown in FIG. 1D.

While boron and carbon show large decreases in the etch rate of the silicon nitride, other species may also be used. For example, an implant of nitrogen at a high current (HC) dose increases the etch rate of the silicon nitride by a factor of about 1.2, but increases the etch rate of the silicon dioxide layer by a factor of between 2.5 and 3.0. In other words, although the etch rate of the mask has been increased, the etch rate of the material being etched (i.e. layer 110) is increased to a greater degree.

While FIGS. 2 and 3 represent the etch rates of silicon nitride and silicon dioxide, respectively, the disclosure is not limited to these embodiments. For example, in certain embodiments, the layer 110 may not be a silicon dioxide layer. In these embodiments, the etch rate modifying species may be different and can be determined by creating a graph, similar to FIG. 3, for the material used in layer 110. Furthermore, in the embodiment where a layer 110 is not disclosed on the workpiece 100, the etch rate modifying species may be a species that increases the difference between the etch rate of the workpiece 100, which may be silicon, and the etch rate of the mask 120.

Figure 4:
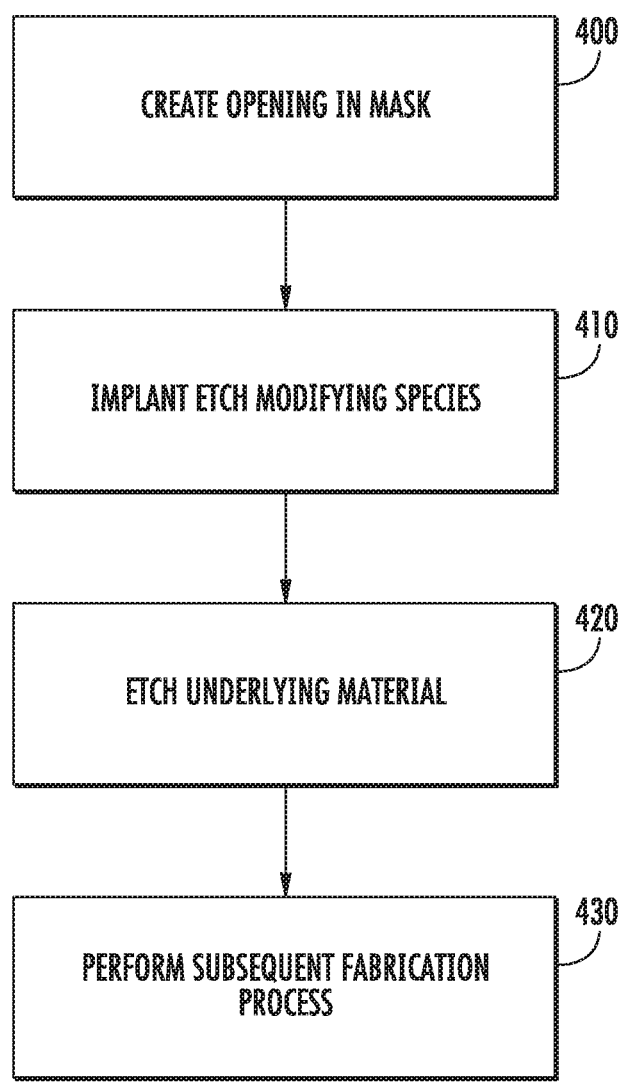
FIG. 4 shows a flowchart representing the sequence shown in FIGS. 1A-1E.

FIG. 4 shows a flowchart illustrating the sequence shown in FIGS. 1A-1E. A workpiece is provided, which includes a mask disposed on its top surface. As described above, in certain embodiments, a layer, such as a silicon dioxide layer, may be disposed beneath the mask, between the mask and the underlying workpiece. In other embodiments, the mask is disposed directly on the workpiece. First, as shown in Process 400, an opening is created in the mask. By creating this opening, a portion of the material disposed beneath the mask is exposed. After the opening is created, an etch rate modifying species is implanted into the workpiece, as shown in Process 410. This ion implantation process implants ions in the mask and also implants ions into the exposed portion of material disposed beneath the mask. This etch rate modifying species increases the difference between the etch rate of the mask and the etch rate of the material. In certain embodiments, the etch rate of the mask is decreased. In certain embodiments, the etch rate of the underlying material is increased. In certain embodiments, both of these etch rates are modified. After the etch rate modifying species has been implanted, the underlying material may be etched, as shown in Process 420. As stated above, the underlying material may be a separate layer, such as a silicon dioxide layer, that is disposed on the workpiece, or may be the workpiece itself. Finally, after the etch process is completed, a subsequent fabrication process, such as an ion implantation process, or metallization process, may be performed, as shown in Process 430.

Thus, in one particular embodiment, a silicon dioxide layer is disposed on the surface of a workpiece. A silicon nitride mask is then disposed on the silicon dioxide layer. Openings are made in the mask to allow for the creation of vertical channels in the silicon dioxide layer. After the openings are made, an ion implantation process using an etch rate modifying species is performed to change the etch rates of at least one of the mask and the silicon dioxide layer. The difference between the etch rate of the mask and the etch rate of the silicon dioxide layer is increased by the implantation of the etch rate modifying species. After the ion implantation is completed, an etching process is performed, to create the desired channel. In certain embodiments, the etch rate modifying species may be boron or carbon, due to their ability to decrease the etch rate of the silicon nitride mask.

FIGS. 5A-5F show a second embodiment. In this embodiment, an epitaxial silicon layer 510 is disposed on the workpiece 500. Disposed on top of the epitaxial silicon layer 510 is a mask 520. The mask 520 may be a nitride material, such as silicon nitride. The mask 520 may be applied directly to the top surface of the epitaxial silicon layer 510. A channel 530 is desired to be created in the epitaxial silicon layer 510. This technique may be used to create a fin having shallow trench isolation (STI).

Figure 5:
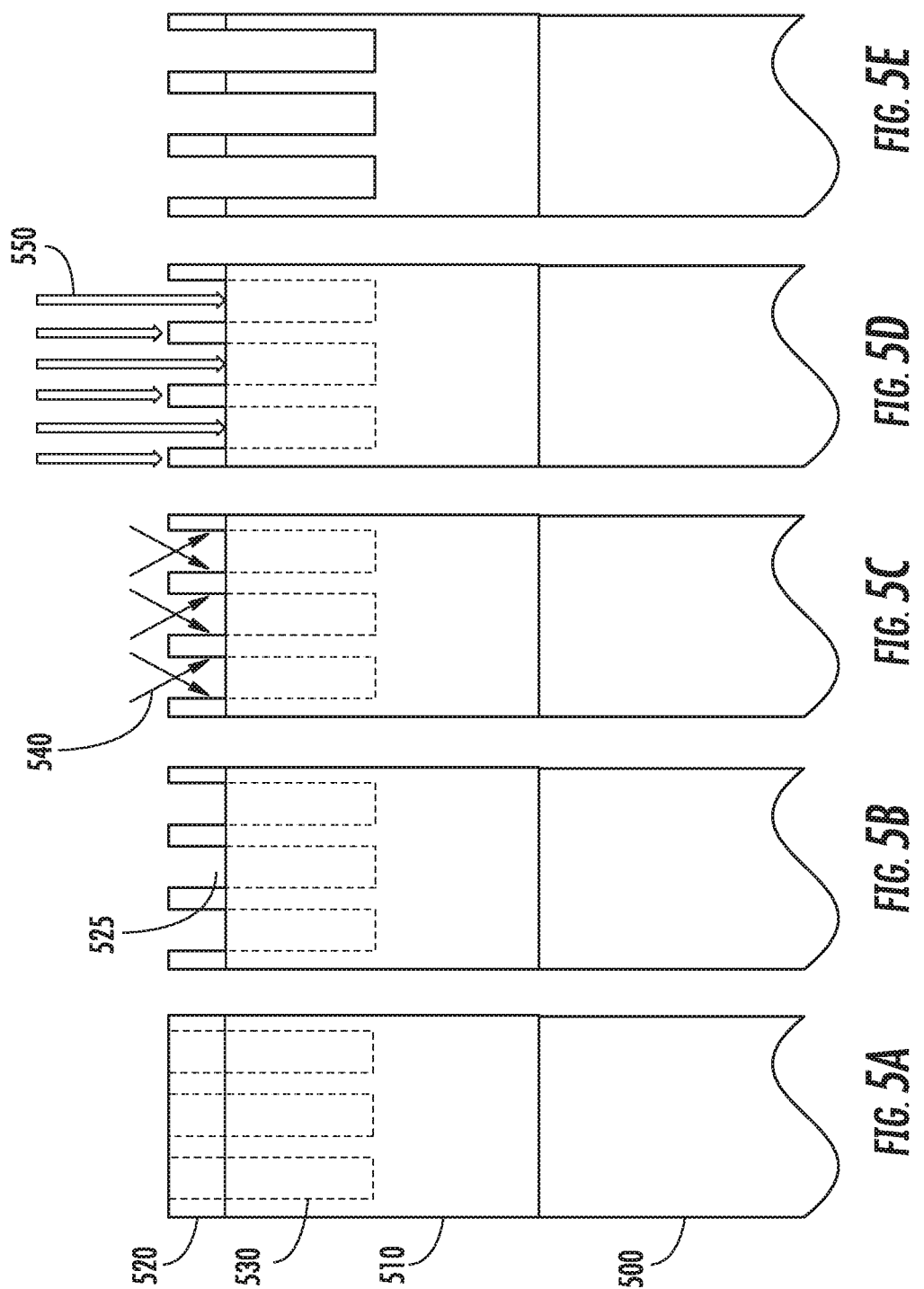
FIG. 5A-5E show a sequence of processes that may be performed on a workpiece according to another embodiment.

In FIG. 5B, an opening 525 is made in the mask 520. This may be performed using a wet etch process, where hydrofluoric acid is used to remove the mask 520 in the target area. This etch process may be referred to as the mask etching process.

After the opening 525 has been created, a first ion implantation process may be performed, as shown in FIG. 5C. This first ion implantation process is used to implant a first etch rate modifying species 540 into the mask 520. In certain embodiments, the first ion implantation process may be an angled implant so that the first etch rate modifying species 540 is implanted into the mask 520, but not into the exposed epitaxial silicon layer 510. The angle of the first ion implantation process may be determined based on the width of the opening 525 and the thickness of the mask 520. The first etch rate modifying species 540 may be a species that reduces the etch rate of the mask 520. For example, if the mask 520 is silicon nitride, species that reduce the etch rate may include, for example, boron, carbon, silicon and germanium.

A second ion implantation process may be performed, as shown in FIG. 5D. This ion second implantation process may implant a second etch rate modifying species 550. The second ion implantation process may be a blanket implant, such that the entirety of the workpiece 500 is implanted with the second etch rate modifying species 550. The second etch rate modifying species 550 may be used to alter the etch rate of the epitaxial silicon layer 510. For example, if the etch rate of the epitaxial silicon layer 510 is to be increased, species such as phosphorus, arsenic and antimony may be used. If the etch rate of the epitaxial silicon layer 510 is to be decreased, species such as carbon, boron, aluminum and gallium may be used. Of course, the disclosure is not limited to these species.

After the first and second ion implantation processes, an etching process is performed, as shown in FIG. 5E. This etching process creates a channel 530 through the epitaxial silicon layer 510.

By implanting the first etch rate modifying species 540 and the second etch rate modifying species 550 prior to the etching process, the amount of mask 520 that is removed by the etching process may be reduced.

The implication of performing both ion implantation processes is that the silicon nitride hard mask thickness may be reduced. A thinner hard mask, coupled with a better etch resistance, will allow for reduced CD variability.

After the etching process has been completed, the channel 530 is created in the epitaxial silicon layer 510, as shown in FIG. 5E. At this point, subsequent processes may be performed.

Figure 6:
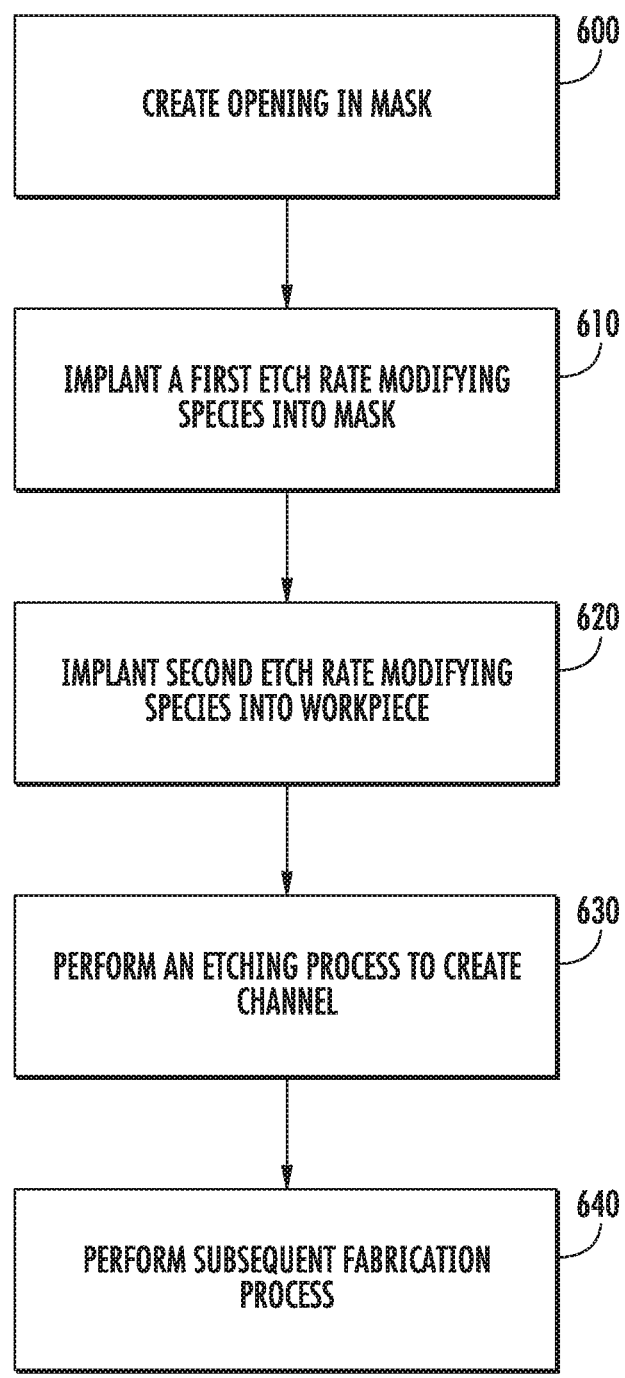
FIG. 6 shows a flowchart representing the sequence shown in FIGS. 5A-5E.

FIG. 6 shows a flowchart illustrating the sequence shown in FIGS. 5A-5E. A workpiece is provided, which includes a mask disposed on its top surface. As described above, a layer, an epitaxial silicon layer, may be disposed beneath the mask. First, as shown in Process 600, an opening is created in the mask. By creating this opening, the epitaxial silicon layer beneath the mask is exposed. After the opening is created, a first etch rate modifying species may optionally be implanted into the mask, as shown in Process 610. This optional first ion implantation process implants ions of a first etch rate modifying species in the mask. To minimize the introduction of the first etch rate modifying species into the epitaxial silicon layer, the first ion implantation process may be performed at an angle. This first etch rate modifying species decreases the etch rate of the mask. After the first etch rate modifying species has been implanted, a second etch rate modifying species may be implanted into the workpiece, as shown in Process 620. The second etch rate modifying species may be implanted using a second ion implantation process. This second ion implantation process may be a blanket implant, such that the entire workpiece is exposed to the second etch rate modifying species. Although two different ion implantation processes are illustrated, in certain embodiments, only one of these ion implantation processes is performed. Further, the first ion implantation process may be performed before or after the second ion implantation process.

After the second ion implantation process, an etching process is performed to create the channel in the epitaxial silicon layer, as shown in Process 630. In certain embodiments, the introduction of the second etch rate modifying species may increase the etch rate of the epitaxial silicon layer. After the etching process is completed, a subsequent fabrication process, such as an ion implantation or metallization process, may be performed, as shown in Process 640.

The embodiments of this disclosure have many advantages. First, the use of an etch rate modifying species to modulate the etch rates of the mask and/or underlying material allows current processes and material to continue to be used in semiconductor fabrication. In other words, the currently used material for a mask may continue to be used, rather than transitioning to a new, more etch resistant material. Further, because of the increase in etch resistance, masks do not have to be made thicker to withstand the newer more aggressive etch processes and may optionally be made thinner. CD variability may be reduced by improving the hard mask etch resistance and optionally reducing the hard mask thickness. Further, the present disclosure offers methods to increase the resistance of hard masks without modification to their thickness or composition. The present disclosure also offers method to increase the etch rate of underlying silicon dioxide layers.

Further, these embodiments may be used in various applications, such as making nitride hard mask films more resistant to etch, increasing the etch rate of underlying silicon dioxide films in contact regions or decreasing the silicon dioxide etch rate in cases where silicon dioxide is being used as a hard mask, and increasing silicon etch rate during the formation of shallow trench isolation in FinFETs or decreasing silicon etch rate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a workpiece, comprising:
creating an opening in a mask disposed on an epitaxial silicon layer, the epitaxial silicon layer disposed on a surface of the workpiece, so as to expose a portion of the epitaxial silicon layer disposed beneath the mask;
implanting a first etch rate modifying species into the mask after creating the opening;
implanting a second etch rate modifying species into the mask and the portion of the epitaxial silicon layer disposed beneath the mask after creating the opening; and
performing an etching process to create a channel in the portion of the epitaxial silicon layer, wherein the first etch rate modifying species decreases an etch rate of the mask; and wherein the second etch modifying species is different from the first etch rate modifying species.

2. The method of claim 1, wherein the first etch rate modifying species is implanted at an angle.

3. The method of claim 1, wherein the first etch rate modifying species comprises boron, carbon, silicon or germanium.

4. The method of claim 1, wherein the second etch rate modifying species increases an etch rate of the epitaxial silicon layer.

5. The method of claim 4, wherein the second etch rate modifying species comprises phosphorus, arsenic, silicon or antimony.

6. The method of claim 1, wherein the second etch rate modifying species decreases an etch rate of the epitaxial silicon layer.

7. The method of claim 6, wherein the second etch rate modifying species comprises carbon, boron, aluminum, gallium or indium.

8. A method of processing a workpiece, comprising:
creating an opening in a mask disposed on an epitaxial silicon layer, the epitaxial silicon layer disposed on a surface of the workpiece, so as to expose a portion of the epitaxial silicon layer disposed beneath the mask;
implanting a first etch rate modifying species into the mask after creating the opening, wherein the implanting is performed at an angle such that the first etch rate modifying species is not implanted into the exposed portion of the epitaxial silicon layer; and
performing an etching process to create a channel in the portion of the epitaxial silicon layer, wherein the first etch rate modifying species alters an etch rate of the mask.

9. The method of claim 8, wherein the first etch rate modifying species comprises boron, carbon, silicon or germanium.

10. The method of claim 8, wherein the angle is determined based on a width of the opening and a thickness of the mask.

* * * * *